United States Patent [19]

Beyers, Jr.

[11] 4,156,850
[45] May 29, 1979

[54] DISPLAY SYSTEM FOR FACILITATING THE SETUP OF A TUNING SYSTEM

[75] Inventor: Billy W. Beyers, Jr., Greenfield, Ind.

[73] Assignee: RCA Corporation, New York, N.Y.

[21] Appl. No.: 828,848

[22] Filed: Aug. 29, 1977

[51] Int. Cl.² .............................................. H04B 1/26
[52] U.S. Cl. .................................. 325/455; 325/464; 358/192
[58] Field of Search ............... 325/453, 455, 459, 464, 325/468; 358/191, 192

[56] References Cited

U.S. PATENT DOCUMENTS

| | | | |
|---|---|---|---|
| 4,023,107 | 5/1977 | Tanaka | 325/455 |
| 4,041,402 | 8/1977 | Mogi | 325/455 |
| 4,081,797 | 3/1978 | Olson | 358/192 |
| 4,122,395 | 10/1978 | Schotz et al. | 325/453 |

FOREIGN PATENT DOCUMENTS

| | | |
|---|---|---|
| 1363048 | 8/1974 | United Kingdom. |
| 1377100 | 12/1974 | United Kingdom. |
| 1386935 | 3/1975 | United Kingdom. |
| 1410363 | 10/1975 | United Kingdom. |
| 1445031 | 8/1976 | United Kingdom. |
| 1471712 | 4/1977 | United Kingdom. |
| 1485740 | 9/1977 | United Kingdom. |

OTHER PUBLICATIONS

"Digitales Programmspeicher-System"-Friedrich Timmermann, Funkschau, Heft 17, Aug. 12, 1977.
Working With Microprocessors-Select the Station the Micro Way-Quentin Scott-Electronics Weekly-Apr. 13, 1977.
General Instruments, AY-3-8330, Data Sheet.
Magnavox Service Manual-703777, Videomatic Touch-Tune Assembly, Manual No. 7353, vol. 12, Sep. 1976.
Farbfernsehgerat mit Mikroprozessor-Steurung-Wolfgang Baum, Aug. 12, 1977, "Funkschau," Heft 17.

Primary Examiner—Robert L. Griffin
Assistant Examiner—Marc E. Bookbinder
Attorney, Agent, or Firm—Eugene M. Whitacre; Paul J. Rasmussen; Peter M. Emanuel

[57] ABSTRACT

In a tuning system for a television receiver including a memory for storing binary signals representing tuning voltages corresponding to various channels a viewer may select, during a tuning voltage setup mode in which the binary signals representing the tuning voltages are generated in response to viewer control, a multiplexer couples predetermined selected ones of the binary signals representing the tuning voltages to a digital channel number display unit to provide a viewer with an indication of the relative tuning position. The multiplexer also couples binary signals representing the letter "A" to the channel number display during the tuning voltage setup mode to distinguish the tuning voltage setup mode from other modes of operation of the tuning system. In addition, during a channel selection setup mode, in which a viewer selects the channels he does not wish skipped during normal operation of the tuning system, the multiplexer couples binary signals representing the letters "CH" to the channel number display to distinguish the channel selection tuning mode from the tuning voltage setup mode and the normal operating mode.

16 Claims, 4 Drawing Figures

Fig. 1

| BINARY | | | | | HEXIDECIMAL | | | | | OCTAL | | | | DECODER | | | | |
|---|---|---|---|---|---|---|---|---|---|---|---|---|---|---|---|---|---|---|
| SYMBOL | $2^0$ | $2^1$ | $2^2$ | $2^3$ | SYMBOL | $2^0$ | $2^1$ | $2^2$ | $2^3$ | SYMBOL | $2^0$ | $2^1$ | $2^2$ | SYMBOL | $2^0$ | $2^1$ | $2^2$ | $2^3$ |
| 0  | 0 | 0 | 0 | 0 | 0 | 0 | 0 | 0 | 0 | 0 | 0 | 0 | 0 | 0 | 0 | 0 | 0 | 0 |
| 1  | 1 | 0 | 0 | 0 | 1 | 1 | 0 | 0 | 0 | 1 | 1 | 0 | 0 | 1 | 1 | 0 | 0 | 0 |
| 2  | 0 | 1 | 0 | 0 | 2 | 0 | 1 | 0 | 0 | 2 | 0 | 1 | 0 | 2 | 0 | 1 | 0 | 0 |
| 3  | 1 | 1 | 0 | 0 | 3 | 1 | 1 | 0 | 0 | 3 | 1 | 1 | 0 | 3 | 1 | 1 | 0 | 0 |
| 4  | 0 | 0 | 1 | 0 | 4 | 0 | 0 | 1 | 0 | 4 | 0 | 0 | 1 | 4 | 0 | 0 | 1 | 0 |
| 5  | 1 | 0 | 1 | 0 | 5 | 1 | 0 | 1 | 0 | 5 | 1 | 0 | 1 | 5 | 1 | 0 | 1 | 0 |
| 6  | 0 | 1 | 1 | 0 | 6 | 0 | 1 | 1 | 0 | 6 | 0 | 1 | 1 | 6 | 0 | 1 | 1 | 0 |
| 7  | 1 | 1 | 1 | 0 | 7 | 1 | 1 | 1 | 0 | 7 | 1 | 1 | 1 | 7 | 1 | 1 | 1 | 0 |
| 8  | 0 | 0 | 0 | 1 | 8 | 0 | 0 | 0 | 1 |   |   |   |   | 8 | 0 | 0 | 0 | 1 |
| 9  | 1 | 0 | 0 | 1 | 9 | 1 | 0 | 0 | 1 |   |   |   |   | 9 | 1 | 0 | 0 | 1 |
| 10 | 0 | 1 | 0 | 1 | A | 0 | 1 | 0 | 1 |   |   |   |   | A | 0 | 1 | 0 | 1 |
| 11 | 1 | 1 | 0 | 1 | B | 1 | 1 | 0 | 1 |   |   |   |   | L | 1 | 1 | 0 | 1 |
| 12 | 0 | 0 | 1 | 1 | C | 0 | 0 | 1 | 1 |   |   |   |   | C | 0 | 0 | 1 | 1 |
| 13 | 1 | 0 | 1 | 1 | D | 1 | 0 | 1 | 1 |   |   |   |   | H | 1 | 0 | 1 | 1 |
| 14 | 0 | 1 | 1 | 1 | E | 0 | 1 | 1 | 1 |   |   |   |   | J | 0 | 1 | 1 | 1 |
| 15 | 1 | 1 | 1 | 1 | F | 1 | 1 | 1 | 1 |   |   |   |   |   |   |   |   |   |

DISPLAY SYSTEM FOR FACILITATING THE SETUP OF A TUNING SYSTEM

BACKGROUND OF THE INVENTION

The present invention relates to the field of tuning systems for television receivers and the like which include a memory for storing binary signals representing tuning information.

Recently, electronic tuning systems have been proposed for television receivers which include a memory for storing binary signals representing tuning voltages for controlling an associated voltage controlled local oscillator in order to tune various channels a viewer may select. Although these memory type of tuning systems tend to be more versatile and less expensive than other types of electronic tuning systems such as, for example, those employing frequency synthesizers, they suffer the disadvantage that at least some programming by the manufacturer, and in some instances by the individual viewer, is required to enter tuning information into the memory.

In some of the proposed memory type tuning systems the size of the memory, i.e., the number of locations in which information can be stored, is limited to reduce the cost of the tuning system. As a result, in these tuning systems only the tuning information for a limited number of preferred channels less than the total number of channels allocated to the television band can be stored. Since the channels preferred by a particular viewer, either because of program content or because of the reception conditions at the viewer's location, are known only to a viewer, for those memory type tuning systems including a memory with only a limited number of memory locations, programming is to be accomplished by the viewer himself. Programming a memory type tuning system involves not only the selection of the preferred channels, but also involves the generation of binary signals representing tuning voltages and channel number display information corresponding to the preferred channels. For viewers who are used to the conventional type of mechanical tuning systems including a mechanical rotary channel selector switch, the programming procedures for a memory type tuning system may present considerable difficulty and lead to unnecessary costly and annoying service calls. Therefore, it is desirable that memory type tuning systems be arranged to simplify as much as possible the required programming procedures.

One of the problems encountered in programming a memory type tuning system is that of correlating a viewable picture to a channel number. That is, as the tuning voltage is adjusted until a viewable picture is produced, unless a station identification interval is fortuitously transmitted while the viewable display is present or the viewer happens to know on what channel the program being displayed is being transmitted, the viewer has no way of knowing the channel to which the receiver is presently tuned and cannot program the corresponding channel number display information.

To overcome this problem, it is possible to provide an electromechanical voltage meter which is responsive to the analog tuning voltage so as to provide a viewer with an indication of the relative tuning position (see, for example, the tuning system disclosed in the "Magnavox Service Manual—703777 Videomatic Touch Tune Assembly," Manual No. 7353, File Volume 12, published by the Magnavox Company, Fort Wayne, Ind.). Not only do electromechanical meters tend to be relatively expensive and, because of their bulk, tend to detract from the appearance of the receiver, but they may be difficult to read by viewers not familiar with electronic equipment. Moreover, electromechanical meters may not provide sufficient resolution between tuning positions where the preferred channels are closely spaced. That is, for example, a viewer may not be able to distinguish between channels 4, 5 or 6.

It is also possible to provide an on-screen display system which provides an on-screen display showing a scale calibrated in channel numbers (rather than in tuning voltages) and a bar which changes length along the scale as a tuning voltage is adjusted (see, for example, the display disclosed in the "General Instrument AY-3-8330—Electronic On-Screen TV Tuning Scale" data sheet available from General Instrument). While such an on-screen display may overcome some of the disadvantages of an electromechanical meter, it may nevertheless be difficult for a viewer to utilize because it provides information in the same analog format as does an electromechanical meter. In addition, on-screen display systems tend to add expense to the cost of the tuning system and therefore may not be provided.

Thus, it is desirable that a memory type tuning system include an arrangement for providing an indication of tuning voltages in a format with which ordinary viewers are relatively familiar and which desirably include provisions which tend to minimize the possibility of confusion on the part of a viewer.

SUMMARY OF THE PRESENT INVENTION

In a tuning system of the type including memory means for storing tuning information for various tuning positions a user may select, multiplexing means selectively couples binary signals corresponding to the tuning positions to a digital display unit so that tuning position symbols for identifying the tuning positions are displayed during the normal operating mode of the tuning system when information is retrieved from the memory to tune the receiver and couples binary signals representing the tuning voltages corresponding to the tuning positions to the display unit so that numbers related to the tuning voltages are displayed during a programming mode in which the binary signals representing the tuning voltages are generated for entry into the memory means.

Desirably, the binary signals representing the tuning voltages which are coupled to the display unit signals are arranged in a predetermined format such that the numbers displayed during the programming mode are linearly related to the tuning voltages.

To further aid a viewer during the setup mode, binary signals representing a predetermined symbol may be coupled to the display means during the programming mode to distinguish it from the normal mode of operation.

DETAILED DESCRIPTION OF THE INVENTION

Figure 1:
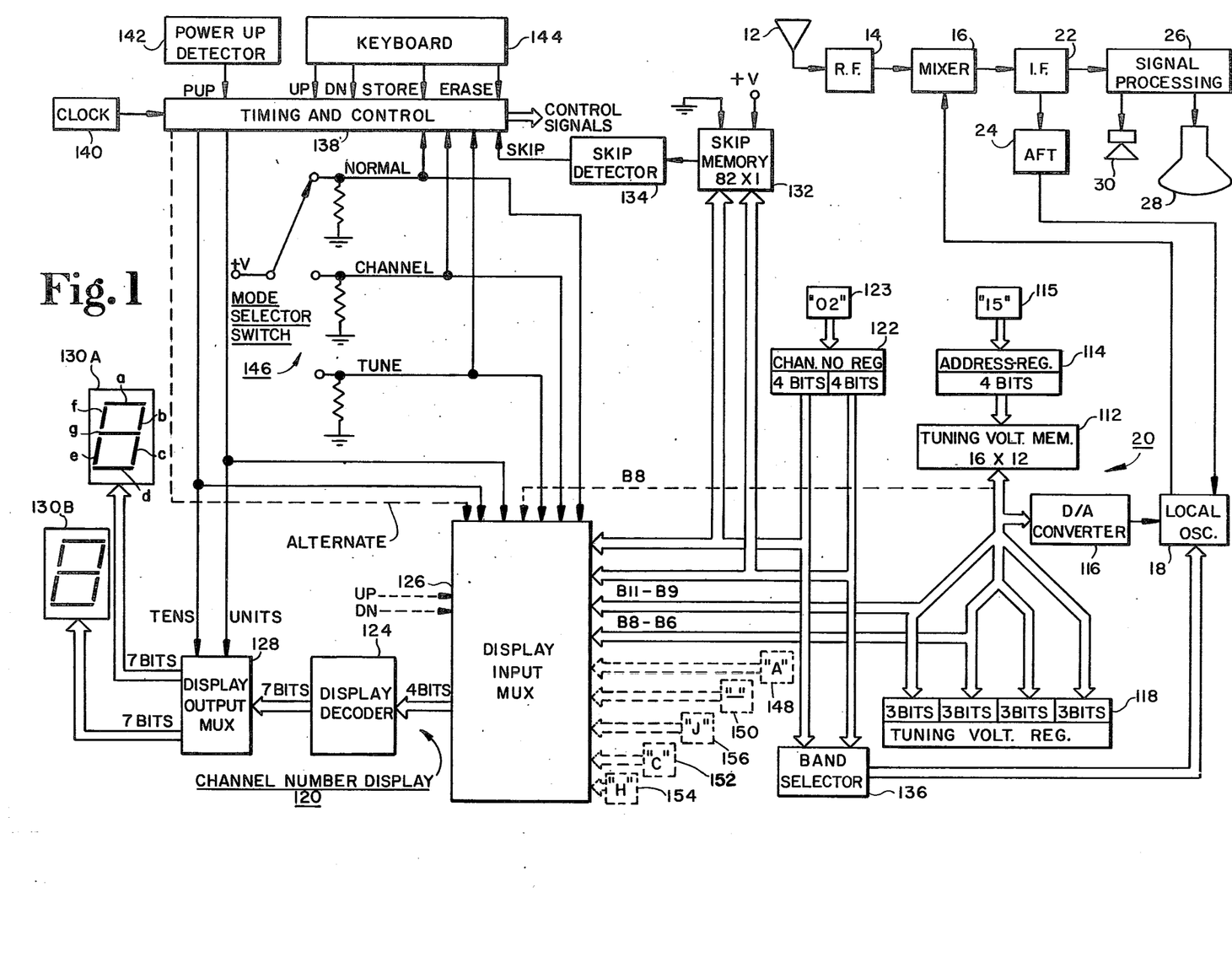
FIG. 1 shows, in block diagram form, a television receiver employing a memory type tuning system with provisions for facilitating its setup by a viewer in accordance with the present invention.

In FIG. 1, RF (Radio Frequency) signals are received by an antenna 12 and coupled to an RF processing unit 14 where they are filtered, amplified and otherwise processed. The processed RF signals are coupled to a mixer 16 where they are combined with a local oscillator signal generated by a local oscillator 18 to produce an IF (Intermediate Frequency) signal. The frequency of the local oscillator signal is controlled in response to a tuning voltage generated by a tuning system 20 in accordance with the channel selected by a viewer so that when it is combined with the RF signals, the IF signal has modulated picture, color and sound carriers at predetermined frequencies. The IF signal is coupled to an IF processing unit 22 where it is filtered, amplified and otherwise processed. A portion of the IF signal is coupled to an AFT (Automatic Fine Tuning) discriminator which generates an AFT signal representing a deviation between the picture carrier frequency and its nominal value, e.g., in the United States, 45.75 MHz, which may occur due to component aging or environmental operating conditions. The AFT voltage is coupled to local oscillator 18 to modify the tuning voltage so as to minimize the deviation between the picture carrier frequency and its nominal value. The output of IF processing unit 22 is coupled to a signal processing unit 26 which processes the various components of the IF signal so that a picture is produced by means of a kinescope 28 and an audio response is produced by means of a speaker 30.

Tuning system 20 is a memory type tuning system which is capable of storing tuning information for tuning a number of preferred channels less than the total number of channels allocated to the television band. For example, while in the United States there are 82 channels (2-83) allocated to the television band by the FCC (Federal Communications Commission), tuning system 20 may be programmed to tune only 16 channels which are preferred by a viewer over the others because of their program content or because of their relative reception characteristics at the viewer's location.

Specifically, tuning system 20 includes a tuning voltage memory 112 for storing the binary signals representing the tuning voltages for each of 16 channels preferred by the viewer. Tuning voltage memory 112 includes 16 memory locations. Each of the memory locations includes 12 memory cells for storing 12 respective binary signals or bits (binary digits) which have either a logic "1" level corresponding to a relatively high voltage +V or a logic "0" level corresponding to the voltage at signal ground. The binary signals stored in each memory location are arranged in straight binary format. Straight binary format means that each of the 12 binary signals represents a power of 2 from 0 to 11 and are arranged in ascending order from right to left.

Each location of tuning voltage memory 112 has an address. As will be described later, the tuning voltage information for the preferred channels is stored in consecutively addressed memory locations in ascending channel number order. An address register 114 including four stages is coupled to tuning voltage memory 112 to generate four binary signals representing, in straight binary format, the decimal numbers 0-15 to address any of the 16 locations of tuning voltage memory 112. Address register 114 is an up/down counter with provisions for entering binary signals coupled to "jam" inputs, such as the CD4029 integrated circuit available from RCA Corporation. The contents of address register 114 (as represented by the four binary signals) may be increased by the decimal number 1 or decreased by the decimal number 1 in response to the appropriate control signals, as will be described.

When a location of tuning voltage memory 112 is addressed, the contents of the addressed location are "read" out of tuning voltage memory 112 and coupled to a digital-to-analog (D/A) converter 116 which converts them to the corresponding tuning voltages for local oscillator 18.

A tuning voltage register 118, including 12 stages arranged as an up/down counter for counting in straight binary format, is coupled to tuning voltage memory 112 to generate 12 binary signals stored in each memory location of tuning voltage memory 112 representing the tuning voltage for each of the preferred channels during a setup mode of operation of tuning system 20. During the setup mode of operation of tuning system 20, the contents of tuning voltage register 118 are increased or decreased in increments of 1 in response to control signals generated under viewer control and are converted by D/A converter 116 to corresponding tuning voltages until the viewer is satisfied with the picture produced by kinescope 28. Selected ones of the binary signals generated by tuning voltage register 118 are coupled to a channel number display unit 120 so that numbers related to the tuning voltage are displayed by which a viewer may verify that the picture corresponds to the channel he wishes programmed as is described below. The contents of tuning voltage register 118 are entered ("written") into the presently addressed memory location of tuning voltage memory 112 in response to viewer control.

The channel number corresponding to a channel selected by a viewer is displayed by channel number display unit 120 in response to binary signals generated by a channel number register 122. Channel number register 122 comprises two 4-stage up/down counters with provisions for entering binary signals at jam inputs such as CD4029 integrated circuits available from RCA Corporation. Each counter generates four binary signals arranged in BCD (Binary Coded Decimal) format (see the code configurations for decimal numbers 0-9 in the table of FIG. 2 in the column labelled "BINARY") representing the ten decimal numbers 0-9. The binary signals generated by the first counter represent the least significant digit (LSD) of the decimal number and the binary signals generated by the second counter represent the most significant digit (MSD) of the channel number. The two counters are cascaded to count between channel numbers 02 and 83 in either increasing or or decreasing order in response to control signals generated in response to viewer control.

In order to reduce the circuitry employed in display unit 120, the binary signals representing the LSD and MSD of the channel number are time multiplexed and sequentially processed by channel number display unit 120. Specifically, the binary signals representing the LSD are coupled to a display decoder 124 by a display unit multiplexer (MUX) 126 during a UNITS timing signal and the binary signals representing the MSD are coupled to display decoder 124 by display input multiplexer 126 during a TENS timing signal. A display decoder 124 converts the four binary signals coupled to its input terminals to seven binary signals, each one of which corresponds to a segment of a seven-segment display unit. The seven binary output signals of display decoder 124 are coupled to a display output multiplexer (MUX) 128 which in turn couples them to units position seven-segment display unit 130A during the UNITS timing signal and to the tens position seven-segment display unit 130B during the TENS timing signal. Seven-segment display units 130A and 130B, which may be, for example, of the light emitting diode or liquid crystal type, include seven segments a–g which are selectively illuminated in response to the logic levels (i.e., either a logic "0" or a logic "1") of the respective binary signals coupled to them to form the decimal numbers 0–9. To form the number 9, for example, segments a, b, c, f and g would be illuminated. The frequency and duty cycle of the display timing signal are selected so that a viewer does not notice any flicker in the channel number display.

The LSD and MSD binary signals generated by channel number register 122 are also coupled to a skip memory 132. Skip memory 132 is a memory containing 82 locations, each having a memory cell for storing one bit. The addresses of the 82 locations of skip memory 132 correspond to the 82 channel numbers between 02 and 83. Thus, for example, when channel number register 122 contains binary signals representing channel number 13, a corresponding memory location of skip memory 132 will be addressed. The purpose of skip memory 132 is to provide an indication, i.e., a logic "1", when a particular channel is to be skipped because it is not one of the channels preferred by a viewer. In response to the presence of a logic "1" in a location of skip memory 132, a skip detector 134 generates a SKIP signal.

The LSD and MSD binary signals generated by channel number register 122 are also coupled to a band selector 136, which may, for example, comprise a read only memory (ROM) to determine from the channel number the frequency band in which the selected channel resides and in response generate a representative band selection signal. Thus, for example, in the United States, band selector 136 generates respective band selection signals for channels 2-6, 7-13 and 14-83. The band selection signals are coupled to local oscillator 18 to control the frequency range in which it oscillates. Local oscillator 18 includes arrangements of varactor diodes which are switched into an oscillator configuration in response to the respective band selection signals to determine the frequency range in which local oscillator 18 oscillates. The specific frequency at which local oscillator 18 oscillates is determined by the magnitude of the tuning voltage.

The timing signals for controlling the sequential operation of tuning system 20 are generated by a timing and control unit 138 by dividing a clock signal generated by a clock oscillator into various timing intervals. The control signals for controlling the transfer of information to and from tuning voltage memory 112 and skip memory 132 and to control the counting operations of address register 114, tuning voltage register 118 and channel number register 122 in the manner set forth below are generated in a timed sequence in response to the timing signals and in response to command signals generated by a power up detector 142, a keyboard 144, a mode selector switch 146 and skip detector 134. Power up detector 142 detects when the power supply voltage for tuning system 20 rises above a predetermined level when power is applied to the receiver after it has been off and in response generates a PUP (Power UP) signal. Keyboard 144 includes push buttons labelled UP, DN (DowN), STORE and ERASE which when depressed by a viewer cause corresponding command signals to be generated and coupled to timing and control unit 138. These command signals determine whether the contents of address register 114, tuning voltage register 118 and channel number register 122 are increased or decreased and whether data is stored in or erased from tuning voltage memory 112 and skip memory 132. Mode selection switch 146 has a NORMAl, CHANNEL and TUNE position for generating corresponding signals to be generated in order to control the operating mode of tuning system 20. The functional operation of control and timing unit 138 in controlling the operation of tuning system 20 is defined by the description set forth below. The structure of control and timing unit 138 may comprise a logic configuration arranged to carry out the operations set forth below similar to the control and timing structure disclosed in detail in copending United States Pat. application Ser. No. 810,877 entitled, "Memory Type Tuning System with Provisions to Facilitate Setup" filed in the name of Charles Martin Wine on June 28, 1977 now U.S. Pat. No. 4,123,713, hereby incorporated by reference. Alternately, control and timing unit 138 may comprise a microprocessor operated in accordance with a program for carrying out the operations set forth below stored in an associated memory such as is disclosed in an article entitled, "Working with Microprocessors—Select the Station the Micro Way" by Quentin Scott appearing in the Apr. 13, 1977 issue of Electronics Weekly. The numerous control interconnections between timing and control unit 138 and various portions of tuning system 20 have been omitted for the sake of clarity of drawing. However, the function of these control interconnections will become clear from the following description of the operation of tuning system 20.

In operation, assuming that mode selector switch 146 has been placed in its NORMAL position, when the receiver is turned on, binary signals representing the lowest channel number, i.e., channel number 02 (as would be displayed by channel number display unit 120), are coupled to channel number register 122 from unit 123 and binary signals representing the number 15 are coupled to address register 114 from unit 115 and entered into the respective registers in response to the generation of a PUP signal. At this point, the contents of the location of skip memory 132 corresponding to channel number 02 are examined by skip detector 134. If a logic "1" is detected, a SKIP signal, representing that channel 2 is not preferred and is to be skipped, is generated. If a logic "0" is detected, a $\overline{\text{SKIP}}$ signal (i.e., the logic complement of the SKIP signal), representing that channel 2 is preferred and not to be skipped, is generated and coupled to timing and control unit 138.

In response to a SKIP signal the contents of channel number register 122 are increased by a count of 1 and the contents of the location of skip memory 132 corresponding to the next channel are examined. This process continues until a $\overline{\text{SKIP}}$ signal is generated. In response to a $\overline{\text{SKIP}}$ signal, the contents of address register 114 are increased by a count of 1 but the contents of channel number register 122 are not further increased. At this point, the contents of channel number register 122 (which is the first address of SKIP memory 132 at which a logic "0" was detected) are displayed by channel number display 120 and the contents of the first location of tuning voltage memory 112 are "read out" and converted to a corresponding tuning voltage.

When a viewer wishes to change the channel, he may do so by depressing either the UP or DN push button on keyboard 144. When the UP push button is depressed, the contents of channel number register 122 are successively increased by a count of 1 until a $\overline{\text{SKIP}}$ signal is generated by skip detector 134. When a $\overline{\text{SKIP}}$ signal is generated, the contents of address register 114 are increased by a count of 1 but the contents of channel number register 122 are not further increased. At this point, the channel number of the second preferred channel is displayed and the corresponding tuning voltage is generated. The operation of tuning system 20 when a DN push button has been depressed to change the channel is similar to the operation of tuning system 20 when the UP push button has been depressed to change the channel, except that the contents of channel number register 122 and address register 114 are decreased by a count of 1 rather than being increased by a count of 1.

As was earlier noted, it is intended that tuning voltage information for the channels preferred by a viewer be stored in consecutive locations of tuning voltage memory 112 in the same order as the corresponding channel numbers. To accomplish this, a viewer first places mode selector switch 146 in its CHANNEL position. In response to the generation of a CHANNEL signal, the contents of channel number register 122 and the contents of address register 114 will be increased until the channel number of the first channel which has a logic "0" in the associated location of skip memory 132 is displayed and the associated location of tuning voltage memory 112 is addressed in the same manner as when a PUP signal is generated when power is first applied to the receiver. If none of the channels have been programmed, channel number 02 will be displayed by channel number display 120 and an unviewable picture will be produced on the screen of kinescope 28 since no skip bits, i.e., logic "1's" have been entered in skip memory 132 and no meaningful tuning voltage information is contained in tuning voltage memory 112. At this point, the viewer should program tuning system 20 to generate the appropriate tuning voltage to produce an acceptable display by placing mode selection switch 146 into its TUNE mode and proceeding as is set forth below. If some channels have been programmed, the channel number for the first channel which has a logic "0" in the associated location of skip memory 132 is displayed and the associated location of tuning voltage memory 112 is addressed so that a viewable picture is produced. At this point, the viewer may reprogram tuning system 20 for this channel to generate an updated tuning voltage in the manner set forth below in order to attempt to improve the picture quality or may depress the UP push button on keyboard 144 to select the next channel to be programmed, if an unacceptable picture is produced, or reprogrammed, if the picture produced is viewable but the viewer wishes to attempt to improve its quality.

If the viewer depresses the UP push button, the contents of channel number register 122 are increased by a count of 1 until another $\overline{\text{SKIP}}$ signal is generated. At this point, the channel number of the next already programmed preferred or unprogrammed channel is displayed and the associated location of tuning voltage memory 112 is addressed.

To program or reprogram the tuning voltage, the viewer should place mode selector switch 146 in its TUNE position and thereafter depress the UP and DN push buttons on keyboard 144 to change the tuning voltage by changing the contents of tuning voltage register 118 until an acceptable picture is obtained on the screen of kinescope 28.

At this point, the viewer must make sure the picture corresponds to the selected channel for which tuning voltage information is to be entered before the tuning voltage information is "written" into tuning voltage memory 112. This is necessary because the picture may correspond to a different channel number than the one displayed by channel number display 120 when mode selector switch 146 was in its CHANNEL position. This may occur, for example, because the viewer has tuned past the correct tuning voltage for the selected channel to the tuning voltage for another channel because the RF carrier for the selected channel was not sufficiently strong to produce an acceptable picture. Of course, a viewer can verify that the display corresponds to the selected channel by waiting until a station identification signal is broadcast. However, considering that such a procedure must be followed for each of the preferred channels to be programmed, this may involve considerable time and is therefore undesirable.

In the present tuning system, the viewer may verify that the display corresponds to the selected channel to be programmed simply by referring to the display produced by channel number display 120 after he has placed mode selector switch 146 in its TUNE position. When mode selector switch 146 is placed in its TUNE position, display input multiplexer 126 decouples the binary signals generated by channel number register 122 representing the LSD and MSD of the channel number from the remainder of channel number display 120 and instead couples selected ones of the binary signals generated by tuning voltage register 118 representing the tuning voltage to the remainder of channel number display 120. As a result, channel number display 120 displays a decimal number approximately related to the tuning voltage to provide a viewer with a relative indication of the tuning position. The selected binary signals generated by tuning voltage register 118 which are coupled to display input multiplexer 126 to the remainder of channel number display 120 are chosen so that the relative tuning voltage number displayed during the TUNE mode is related in a linear fashion to the tuning voltage without portions in the range which will be unintelligible or confusing to the average viewer as will be explained below. By reference to a relative tuning voltage table which relates the tuning voltage number displayed by channel number display 120 when tuning system 20 is in the TUNE mode to respective channel numbers, the viewer will be able to verify that the picture obtained during the TUNE mode and the corresponding tuning voltage corresponds to the channel to be programmed.

To enter the binary signals representing the tuning voltage, a viewer depresses the STORE button on keyboard 144. In response to the generation of a STORE signal, the contents of tuning voltage register 118 are transferred to and "written" into the presently addressed location of tuning voltage memory 112. Simultaneously, in response to the STORE signal, a logic "0" (provided by a connection to signal ground) is coupled to and "written" into the presently addressed location of skip memory 132.

If the picture for the channel to be programmed is unacceptable to a viewer or corresponds to another channel as determined by the relative tuning voltage number displayed during the TUNE mode, the viewer should depress the ERASE push button. In response to the generation of the ERASE signal, a logic "1" (provided by a connection to a source of the +V supply voltage) is coupled to and "written" into the presently addressed location of skip memory 132.

After a channel has been programmed, the viewer should place mode selector switch 146 into its CHANNEL position so that the next channel can be programmed or reprogrammed.

In tuning system 20, in order to provide a numerical display which is linearly related to the tuning voltage generated during the TUNE mode, the three most significant bits corresponding to $2^{11}$–$2^9$, indicated by B11–B9 in FIG. 1, generated by tuning voltage register 118 are coupled by display input multiplexer 126 to display decoder 124 instead of the binary signals representing the MSD of the channel number during the TENS timing signal and the next three most significant bits, corresponding to $2^8$–$2^6$, indicated by B8–B6 in FIG. 1, generated by tuning voltage register 118 are coupled by display input multiplexer 128 to display decoder 124 instead of the binary signals representing the LSD of the channel number during the UNITS timing signal. With this configuration, as the contents of tuning voltage register 118 are varied in a range from a first extreme corresponding to the lowest magnitude tuning voltage to a second extreme corresponding to the highest magnitude tuning voltage, the numbers in the tens and units display positions vary between 0 and 7 in accordance with the octal coding format indicated in the column labelled "OCTAL" of the table of FIG. 2. It will be noted that with the three bit octal format there are no code configurations after the code configuration for the number 7. Thus, with this octal format, there will be no code configurations generated for which there is no available meaningful numerical display as is the case for the straight binary and hexidecimal code formats discussed above. That is, when the octal format is utilized, channel number display 120 will change in a linear relationship to the tuning voltage between numbers 00 and 77 without any gaps in which the display is not linearly related to the tuning voltage.

Figure 2:
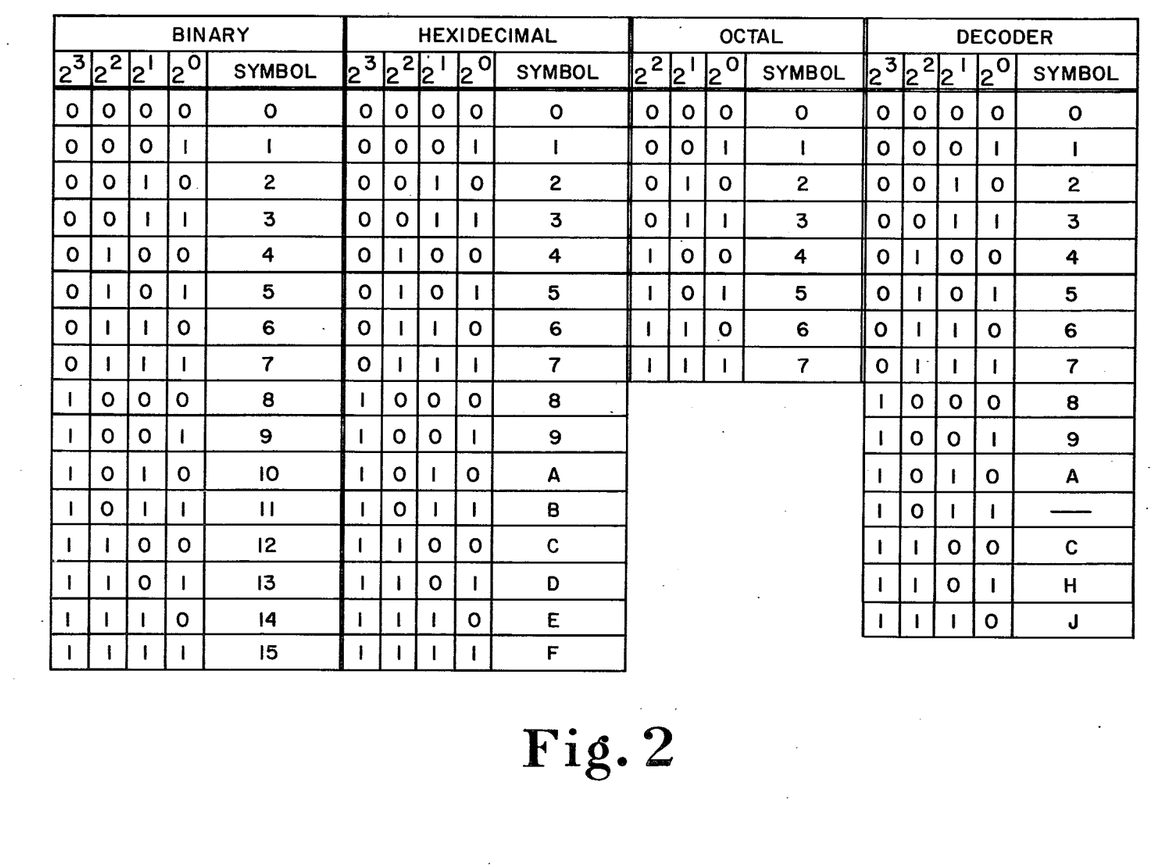
FIG. 2 shows a table indicating certain binary code formats useful in facilitating an understanding of the operation of the setup provisions shown in FIG. 1.

By comparison, this is not the case when either straight binary or hexidecimal codes are utilized. With reference to the column labelled "BINARY" of the table of FIG. 2, it will be noted that although each display position of channel number display 120 is capable of displaying only ten decimal numbers, i.e., 0–9, if a four bit straight binary code is utilized, e.g., by coupling binary signals B11–B8 to channel number display 120, after the number 9 is displayed in either display position, since the four bits corresponding to either display position may assume code configurations corresponding to numbers greater than 9, i.e., numbers 10–15, six more code configurations could be generated for which there are no symbols which meaningfully correspond to the magnitude of the tuning voltage and there would be an interval when the display would not linearly correspond to the tuning voltage. If a four bit hexidecimal code, as is indicated in the column labelled "HEXIDECIMAL" of the table of FIG. 2, is utilized, although letters A-F could be displayed for the six code configurations remaining after the code configuration for the number 9, the letters A-F would tend to be confusing to a viewer.

Figure 3:
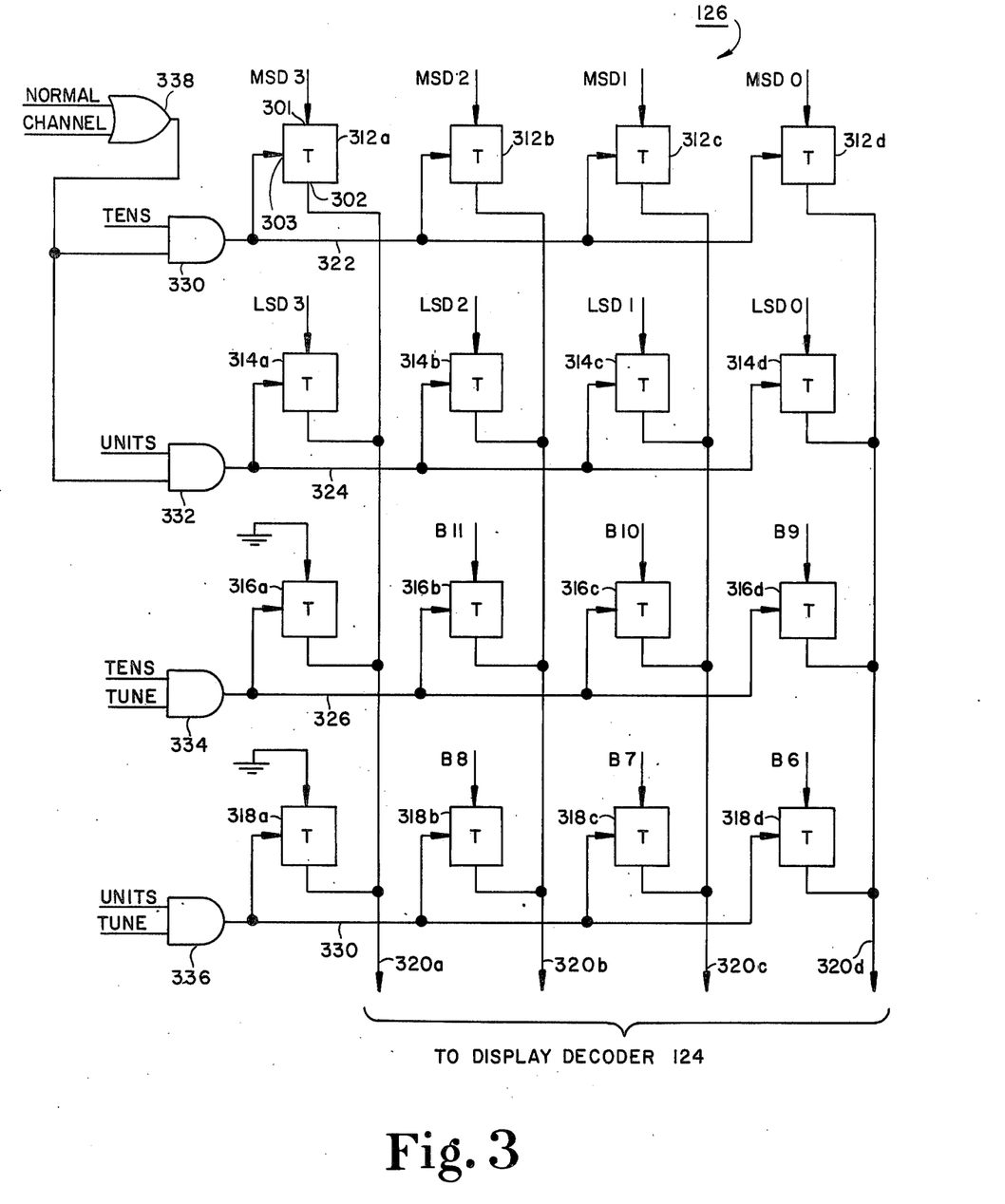
FIGS. 3 and 4 show, in logic diagram form, respective implementations of portions of the tuning system shown in block diagram form in FIG. 1 arranged to facilitate its setup by a viewer.

FIG. 3 shows a logic implementation of display input multiplexer 126 for coupling the six most significant bits B11-B6 to the remainder of channel number display 120 in octal format in order to display a two digit number linearly related to the tuning voltage during the TUNE mode of operation of tuning system 20. Display input multiplexer 126 of FIG. 3 comprises a 4×4 rectangular array of transfer (T) gates 312a–d, 314a–d, and 318a–d. Each transfer T gate has an input terminal 301, an output terminal 302 and a control terminal 303 for controlling the transfer of data between input terminal 301 to output terminal 302. As long as a logic "0" is applied to the control terminal 303 of a transfer gate, the input terminal 301 is decoupled from the output terminal 302 so that whatever signal is coupled to input terminal 301 is prevented from affecting the condition of the signal level at output terminal 302. When a logic "1" is applied to control terminal 303 of a transfer gate, whatever signal is coupled to its input terminal 301 is transferred to its output terminal. The output terminal 302 of each transfer gate in a column is coupled to a respective one of four common output lines 320a–d. Output lines 320a–d of display input multiplexer 126 of FIG. 3 are the four input lines of display decoder 124 of FIG. 1. The input terminals of each transfer gate in a row is coupled to a respective one of four common control lines 322–328. The control signal on each one of control lines 322–328 is generated by a respective one of four AND gates 330–336.

It will be noted that there are four bits associated with the tens and units positions of the channel number display while there are only three bits associated with the tens and units positions of the tuning voltage display. To accommodate this difference, a logic "0," provided by means of a connection to signal ground, is continually coupled to input terminals 301 of transfer gates 316a and 318a of the rows associated with the tens and units positions of the tuning voltage number display.

The output of AND gate 330 will become a logic "1" and, as a result, the binary signals representing the tens position of the channel number, i.e., MSD3–MSD0 corresponding to bit positions $2^3$–$2^0$, will be transferred to display decoder 124 only when the TENS timing signal has a logic "1" level and either the NORMAL signal or CHANNEL signal, coupled to an OR gate 338, has a logic "1" level. The output of AND gate 332 will become a logic "1" and, as a result, the binary signals representing the units position of the channel number, i.e., LSD3–LSD0 corresponding to bit positions $2^3$–$2^0$, will be transferred to display decoder 124, only when the UNITS timing signal has a logic "1" level and either the NORMAL or CHANNEL signal has a logic "1" level. The output of AND gate 334 will become a logic "1", and, as a result, binary signals B11–B9 representing the tens position in octal format of the tuning voltage number will be transferred to display decoder 124 only when the TENS timing signal and the TUNE signal have logic "1" levels. The output of AND gate 336 will become a logic "1" and, as a result, binary signals B8–B6 representing the units position of the tuning voltage number will be transferred to display decoder 124 only when the UNITS timing signal and the TUNE signal have logic "1" levels. The binary signals coupled to the display decoder 124 are decoded in accordance with the code indicated in the column labelled "DECODER" in the table of FIG. 2.

With the logic arrangement of display input multiplexer 126 shown in FIG. 3, as the contents of the tuning voltage register 118 are changed to change the tuning voltage from one magnitude extreme to the other, the tuning voltage number will change in a corresponding linear fashion between the two digit number 00 and the two digit number 77. Since the channel number is also a two digit number, a viewer may be confused as to whether tuning system 20 is in its normal operating mode, channel selection mode or tuning voltage adjustment mode. To avoid such confusion, it is desirable to display only a one digit number rather than a two digit number to indicate the tuning voltage during the TUNE mode. To further avoid confusion, it is desirable to display a symbol to indicate to a viewer when tuning system 20 is in the CHANNEL mode and another symbol when tuning system 20 is in the TUNE mode.

To display a one digit number rather than a two digit number representing the tuning voltage, only the three most significant binary signals, B11-B9 (rather than the two groups of binary signals B11-B9 and B8-B6), are coupled to display input multiplexer 126. Display input multiplexer 126 couples binary signals B11-B9 to display decoder 124 and the resulting seven bit display code is coupled to units position display unit 130 during the UNITS timing signals. Since the binary signals change from a code configuration corresponding to the decimal number 0 to a code configuration corresponding to the decimal number 7 as the tuning voltage is changed, there will be no code configurations which are not capable of being displayed in an intelligible form by units display 130A and as a result the tuning voltage number will change linearly with the tuning voltages through the tuning voltage range.

In order that a viewer be better able to distinguish between the channel selection and the tuning voltage adjustment modes, when mode selector switch 146 is placed in the TUNE position, as long as the viewer is not adjusting the tuning voltage by means of the UP and DN push buttons of keyboard 144, the letter "A", corresponding to appropriately coded binary signals coupled to display input multiplexer 126 from a unit 148, is displayed continually in tens position 130B and the letter "J," corresponding to appropriately coded binary signals coupled to display input multiplexer 126 from a unit 156, is continually displayed in the units position so that the symbol "AJ" for AdJustment is displayed. When the viewer adjusts the tuning voltage by means of the UP and DN push buttons, as the correspondingly changing one digit tuning voltage number is displayed in units position 130A, the letter "A" is displayed in the tens position 130B. Because only the three most significant binary signals B11-B9 are coupled to channel number display unit 120, the tuning voltage will appear to change very slowly and may tend to confuse a viewer into believing that the tuning voltage is not changing in response to his control. To overcome this, binary signals, provided by a unit 150 by means of corresponding connections between the source of the voltage +V and signal ground, representing the symbol "-" (dash) are coupled to display input multiplexer 126 to be alternately displayed in place of the letter "A" in tens position 130B when the tuning voltage is being adjusted during the TUNE mode. It is desirable to utilize a timing signal to cause display of the letter "A" and the symbol "-" (dash) to be alternately displayed which is related to the rate of change of the tuning voltage. Since the binary signal B8 of tuning voltage register 118 changes at a rate which is equal to one-half the rate at which the least significant binary signal coupled to channel number display 120, i.e., B9, changes, it has a rate equal to one-half the rate at which the tuning voltage number displayed changes, and it is thus a desirable choice for this purpose.

To distinguish the CHANNEL mode from the TUNE mode, binary signals representing the letter "C", provided by a unit 152, and binary signals representing the letter "H", provided by a unit 154, are coupled to display input multiplexer 126 to be displayed in tens position 130B and units position 130A as the symbol "CH" (for CHannel) alternately with the two digit channel number when mode selector switch 146 is in the CHANNEL mode. To alternate the display of the symbol "CH" with the two digit channel number, a timing signal ALTERNATE having, for example, a period of approximately 2 seconds, generated by timing and control unit 138 is coupled to display input multiplexer 126.

Figure 4:
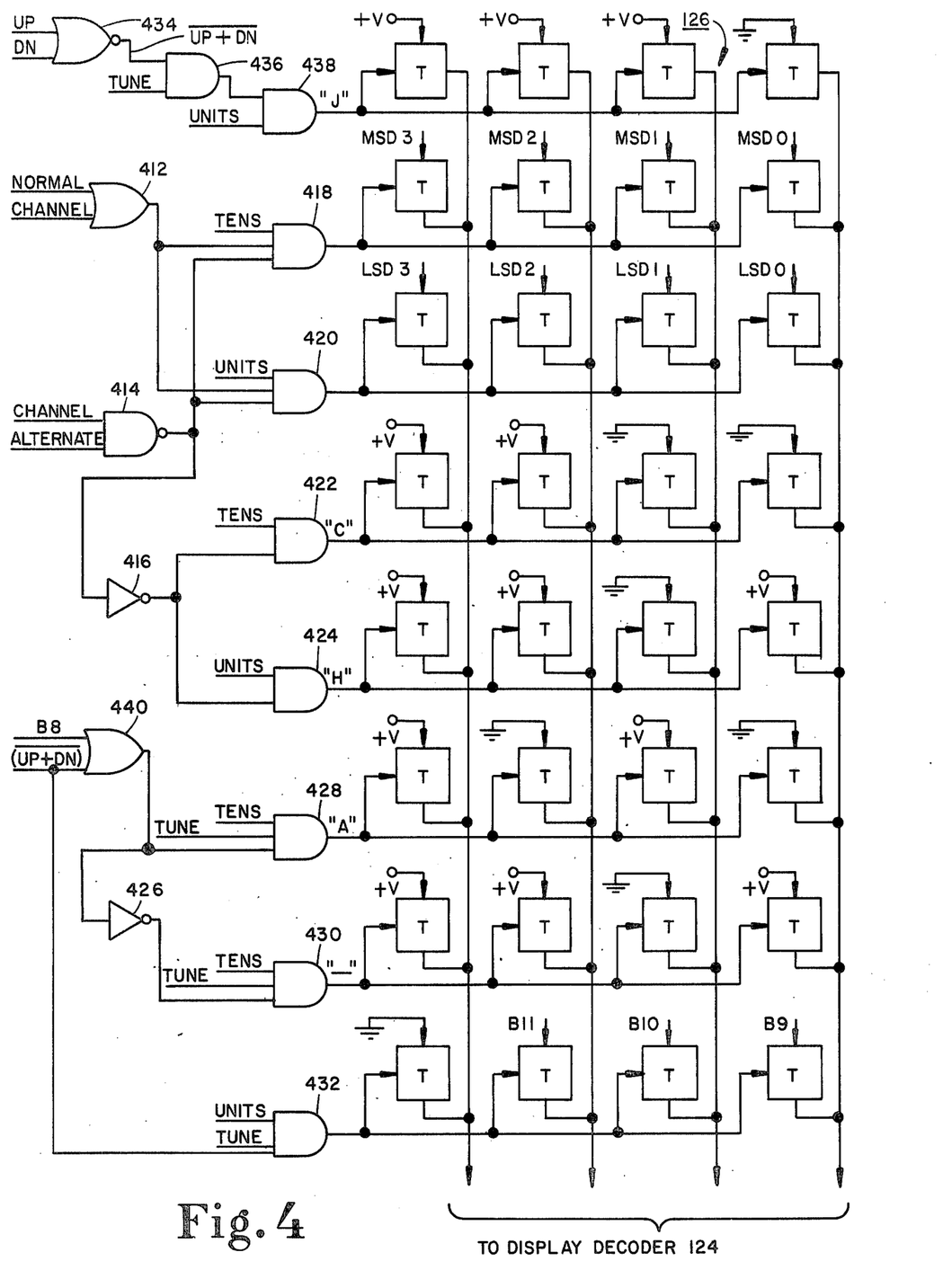

FIG. 4 shows 4×7 transfer (T) gates arranged to: (1) continuously display a two digit channel number during the NORMAL mode; (2) alternately display a two digit channel number and the symbol "CH" during the CHANNEL mode; (3a) continually display the symbol "AJ" when the tuning voltage is not being adjusted by means of the UP and DN push buttons during the TUNE mode; and (3b) display a one digit tuning voltage number in units position 130A of the display and alternately display the symbols "A" and "-" in tens position 130B of the display when the tuning voltage is being adjusted by means of the UP and DN push buttons during the TUNE mode. The logic arrangement shown in FIG. 4 is similar to that shown in FIG. 3. OR gate 412, NAND gate 414, INVERTER 416 and AND gates 418, 426, 422 and 424 control the transfer of information to display decoder 124 to accomplish functions (1) and (2) set forth above. NOR gate 434 and AND gates 436 and 438 control the transfer of information to display decoder 124 to accomplish function (3a) set forth above. NOR gate 440, INVERTER 416 and AND gates 428, 430 and 432 control the transfer of information to display decoder 124 to accomplish function (3b) set forth above. Display decoder 124 is arranged to decode the groups of four binary signals coupled to it to form the desired number and symbols in accordance with the code set forth in column labelled "DECODER" of the table of FIG. 2.

To facilitate the setup of tuning system 20, it may also be desirable to display symbols representing the tuning band in tens display position 130B next to the tuning voltage number displayed in units display position 130A. To accomplish this, assuming that there are three tuning bands, binary signals representing the letters "A", "B" and "C" corresponding to the first, second and third tuning bands, respectively, may be coupled to display input multiplexer 126. When a tuning voltage for a channel in the first band is generated, the binary signals representing the letter "A" would be coupled by display input multiplexer 126 to the remaining portion of channel number display 120 so that the letter "A" is displayed in tens position 130B and the corresponding one digit tuning voltage number is displayed in units position 130A and so on for the remaining two bands. To detect the band, it is possible to utilize a modulo 3 up/down counter (i.e., an up/down counter having three output states), the contents of which are increased by a count of 1 each time the contents of tuning voltage register 118 correspond to the maximum tuning voltage magnitude, e.g., each time the contents of tuning voltage register 118 change from all logic "1's" to all logic "0's", and which are decreased by a count of 1 each time the contents of tuning voltage register 118 correspond to a minimum tuning voltage magnitude, e.g., each time the contents of tuning voltage register 118 change from all logic "0's" to all logic "1's". These and other modifications are contemplated to be within the scope of the present invention.

What is claimed is:

1. In a tuning system for a receiver of the type including memory means for storing tuning information for various tuning positions a user may select and control means for controlling the entry of said tuning information into said memory means during a programming mode of operation of said tuning system and the retrieval of tuning information from said memory means during a normal mode of operation of said tuning system, apparatus comprising:

mode selector means coupled to said control means for selectively generating one of a NORMAL signal to cause said tuning system to operate in said normal mode and at least a TUNE signal to cause said tuning system to operate in said programming mode;

tuning position means coupled to said control means for generating binary signals corresponding to said tuning position in response to user control;

tuning voltage means coupled to said control means for generating binary signals representing tuning voltages corresponding to said tuning positions in response to user control;

display means for displaying predetermined symbols in response to respective coded arrangements of binary signals; and multiplexing means for selectively coupling said binary signals corresponding to said tuning positions to said display means so that tuning position symbols for identifying said tuning positions are displayed in response to said NORMAL signal and coupling predetermined ones of said binary signals representing said tuning voltages to said display means so that numbers related to said tuning voltages are displayed in response to said TUNE signal.

2. The apparatus recited in claim 1 wherein said multiplexer means couples predetermined ones of said binary signals representing said tuning voltages to said display means so that said numbers displayed in response to said TUNE signal are linearly related to said tuning voltages.

3. The apparatus recited in claim 2 wherein said tuning position means includes a tuning position counter for generating at least four binary signals arranged in binary coded decimal format representing at least one decimal digit;

said tuning voltage means includes a tuning voltage counter for generating binary signals arranged in straight binary format;

said display means includes at least one digit display position for displaying the decimal numbers 0 through 9;

said multiplexer means couples said four binary signals arranged in binary coded decimal format to said display means so that said one digit display position displays decimal numbers 0 through 9 in response to said NORMAL signal; and said multiplexer means couples the three most significant binary signals arranged in octal format to said display means so that said one digit display position displays numbers in a range between 0 and 7 in response to said TUNE signal.

4. The apparatus recited in claim 1 wherein said multiplexing means includes means for selectively coupling binary signals representing a first non-numerical symbol indicative of said programming mode to said display means to be displayed thereby in response to said TUNE signal.

5. The apparatus recited in claim 4 wherein said tuning position means includes a tuning position counter for generating binary signals representing two digit decimal numbers corresponding to said tuning positions;

said display means includes a first display position and a second display position;

said multiplexing means couples said binary signals representing said two digit decimal numbers corresponding to said tuning positions to said display means so that the tens digits of said two digit decimal numbers corresponding to said tuning positions are displayed in said first display position and the units digits of said two digit decimal numbers corresponding to said tuning positions are displayed in said second display position in response to said NORMAL signal; and said multiplexing means selectively couples said binary signals representing said first symbol and said predetermined ones of said binary signals representing said tuning voltage to said display means so that said first symbol is displayed in one of said first and second display positions and said numbers related to said tuning voltages are displayed in the other of said first and second display positions in response to said TUNE signal.

6. The apparatus recited in claim 5 wherein said first symbol is displayed in said first display position and said numbers related to said tuning voltage are displayed in said second display position.

7. The apparatus recited in claim 6 wherein said first symbol is the letter "A."

8. The apparatus recited in claim 7 wherein said multiplexing means includes means for periodically disabling display of the letter "A."

9. The apparatus recited in claim 8 wherein said tuning position means includes up and down control means for generating an UP control signal to increase the contents of said tuning voltage counter and a DOWN control signal to decrease the contents of said tuning voltage counter; and said multiplexing means includes means for coupling binary signals representing the letter "J" to said display means, said multiplexing means selectively coupling the binary signals representing the letter "A" and the binary signals representing the letter "J" to said display means so that the letter "A" is continually displayed in said first display position and said letter "J" is continually displayed in said second display position in response to the absence of both said UP and DOWN control signals and the presence of said TUNE signal.

10. The apparatus recited in claim 8 wherein said means for periodically disabling the display of the letter "A" includes means for periodically decoupling said binary signals representing said letter "A" from said display means and coupling binary signals representing a second symbol to said display means instead.

11. The apparatus recited in claim 8 wherein
said means for periodically disabling the display of the letter "A" includes means for decoupling said binary signals representing the letter "A" from said display means in response to a predetermined logic level of a predetermined one of said binary signals representing said tuning voltages.

12. The apparatus recited in claim 11 wherein
said predetermined one of the binary signals representing said tuning voltage has a rate of change which is equal to one-half the rate of change of the least significant one of said three most significant signals representing said tuning voltage.

13. The apparatus recited in claim 6 wherein
said tuning voltage means includes a tuning voltage counter for generating binary signals arranged in straight binary format representing said tuning voltage; and
said multiplexing means couples the three most significant of said binary signals representing said tuning voltages arranged in octal format to said display means so that numbers in the range 0 through 7 are displayed in said second display position in response to said TUNE signal.

14. The apparatus recited in claim 4 wherein
said mode selector means selectively generates a CHANNEL signal to cause said tuning system to operate in said programming mode; and
said multiplexing means includes means for coupling binary signals representing a second symbol, different from said first, to said display means to be displayed thereby in response to said CHANNEL signal.

15. The apparatus recited in claim 14 wherein
said tuning display means includes a tuning counter for generating binary signals representing two digit decimal numbers corresponding to said tuning positions;
said tuning display means includes up and down control means for generating an UP control signal to increase the contents of said tuning voltage counter and a DOWN control signal to decrease the contents of said tuning voltage counter;
said display means includes a first display position and a second display position;
said multiplexing means couples said binary signals representing said two digit decimal numbers corresponding to said tuning positions to said display means so that the tens digits of said two digit numbers corresponding to said tuning positions are displayed in said first display position and the units digits of said two digit numbers corresponding to said tuning positions are displayed in said second display position in response to said NORMAL signal;
said multiplexer means includes means for coupling binary signals representing the letter "A", binary signals representing the letter "J", and said predetermined binary signals representing said tuning voltages to said display means so that the letter "A" is displayed in said first display position and said numbers related to said tuning voltages are displayed in said second display position in response to the presence of one of said UP and DOWN control signals and the presence of said TUNE signal so that the letter "A" is displayed in said first display position and the letter "J" is displayed in said second display position in response to the absence of both of said UP and DOWN control signals and the presence of said TUNE signal; and
said multiplexer means includes means for coupling binary signals representing the letter "C" and binary signals representing the letter "H" to said display means so that the letter "C" is displayed in said first display position and the letter "H" is displayed in said second display position during a first portion of a timing signal and means for coupling said binary signals representing said two digit decimal numbers corresponding to said tuning positions to said display means so that the tens digits of said two digit decimal numbers corresponding to said tuning positions are displayed in said first display position and the units digits of said two digit decimal numbers corresponding to said tuning positions are displayed in said second display position during a second portion of said timing signal in response to said CHANNEL signals.

16. The apparatus recited in claim 15 wherein said tuning voltage means includes tuning voltage counter means for generating binary signals in straight binary format representing said tuning voltage; and
said multiplexing means couples the three most significant binary signals representing said tuning voltage in octal format to said display means so that numbers in the range between 0 and 7 are displayed in said second display position in response to said TUNE signal.

* * * * *

UNITED STATES PATENT AND TRADEMARK OFFICE
CERTIFICATE OF CORRECTION

PATENT NO. : 4,156,850

DATED : May 29, 1979

INVENTOR(S): BILLY WESLEY BEYERS, JR.

It is certified that error appears in the above-identified patent and that said Letters Patent is hereby corrected as shown below:

Column 10, line 10, after "314a-d," insert -- 316a-d --.

Signed and Sealed this

Sixth Day of November 1979

[SEAL]

Attest:

RUTH C. MASON
Attesting Officer

LUTRELLE F. PARKER
Acting Commissioner of Patents and Trademarks